(12) United States Patent
Kang

(10) Patent No.: US 8,035,428 B2
(45) Date of Patent: Oct. 11, 2011

(54) POWER-UP CIRCUIT FOR SEMICONDUCTOR MEMORY DEVICE

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 157 days.

(21) Appl. No.: 12/495,282

(22) Filed: Jun. 30, 2009

(65) Prior Publication Data

US 2010/0315133 A1    Dec. 16, 2010

(30) Foreign Application Priority Data

Jun. 16, 2009    (KR) .................. 10-2009-0053444

(51) Int. Cl.
*H03L 7/00*    (2006.01)
(52) U.S. Cl. ................ 327/143; 327/142; 327/198
(58) Field of Classification Search .......... 327/142, 327/143, 198
See application file for complete search history.

(56) References Cited

U.S. PATENT DOCUMENTS

| 5,369,310 | A  | * | 11/1994 | Badyal et al. | 327/143 |
| 5,831,460 | A  | * | 11/1998 | Zhou | 327/143 |
| 6,476,651 | B1 | * | 11/2002 | Watanabe | 327/143 |
| 6,937,074 | B2 | * | 8/2005 | Shin | 327/143 |
| 7,348,816 | B2 | * | 3/2008 | Shin | 327/143 |
| 7,675,331 | B2 | * | 3/2010 | Jung | 327/143 |
| 7,679,415 | B2 | * | 3/2010 | Chi | 327/291 |
| 7,701,265 | B2 | * | 4/2010 | Maeda | 327/143 |
| 7,852,129 | B2 | * | 12/2010 | Do | 327/143 |
| 2004/0012418 | A1 | * | 1/2004 | Kim | 327/143 |
| 2004/0070430 | A1 | * | 4/2004 | La Rosa | 327/143 |
| 2006/0103437 | A1 | * | 5/2006 | Kang | 327/143 |
| 2008/0238500 | A1 | * | 10/2008 | Jung | 327/143 |
| 2009/0160505 | A1 | * | 6/2009 | Rho | 327/143 |
| 2009/0302902 | A1 | * | 12/2009 | Do | 327/143 |

FOREIGN PATENT DOCUMENTS

KR    1020070005839    1/2007

OTHER PUBLICATIONS

Notice of Preliminary Rejection issued from Korean Intellectual Property Office on Nov. 30, 2010.

* cited by examiner

*Primary Examiner* — Lincoln Donovan
*Assistant Examiner* — Adam Houston
(74) *Attorney, Agent, or Firm* — IP & T Group LLP

(57) ABSTRACT

A power-up circuit for a semiconductor memory device includes a voltage division unit configured to divide a power supply voltage, a first power-up generation unit configured to detect a voltage level of a first divided voltage of the voltage division unit during an initial stage of applying a power supply to generate a first power-up signal and a second power-up generation unit configured to detect a voltage level of a second divided voltage of the voltage division unit, after the first power-up signal is generated from the first power-up generation unit, to generate a second power-up signal.

18 Claims, 4 Drawing Sheets

POWER-UP CIRCUIT FOR SEMICONDUCTOR MEMORY DEVICE

CROSS-REFERENCE TO RELATED APPLICATIONS

The present application claims priority of Korean Patent Application No. 10-2009-0053444, filed on Jun. 16, 2009, the disclosure of which is incorporated herein by reference in its entirety.

BACKGROUND OF THE INVENTION

The present invention relates to a semiconductor memory device, and more particularly, to a power-up circuit for generating a stable power-up signal.

Generally, devices which perform analog circuit operations are designed to have a reference voltage and may operate at a specific voltage. If a device operates at an undesired voltage level that may be caused when a reference voltage significantly changes during operations or fails to be reset, characteristics of the device deteriorate and productivity of the device is decreased.

Varying characteristics during the operation of devices can be can be compensated/offset/reduced by adding a capacitor, a regulator circuit or a calibration circuit. Using an appropriate initial value before the supply of power is mostly determined by a power-up circuit. If the power-up circuit fails to apply an accurate initial level, a target level may not be provided during operation or within a certain time required in a specification. Therefore, a semiconductor memory device does not operate in response to a voltage level of an external power supply voltage immediately after the external power supply voltage is applied, but operates after the power supply voltage rises higher than a certain level. For this reason, a semiconductor memory device typically includes a power-up circuit.

The power-up circuit protects an overall semiconductor memory device from being damaged by a latch-up or the like when an internal circuit operates before a voltage level of an external power supply voltage is stabilized. Hence, the reliability of an overall chip is improved. Therefore, the power-up circuit is designed to generate a power-up signal that rises with the voltage level of the external power supply voltage and becomes a low level (or a high level) when the external power supply voltage reaches a sufficient level.

FIG. 1 is a circuit diagram of a conventional power-up circuit.

When a device is turned on and a voltage level of a power supply voltage rises, a power-up circuit of FIG. 1 turns on a bandgap circuit which is a reference voltage generator.

As illustrated in FIG. 1, the power-up circuit includes two resistors R1 and R2 connected in series between a power supply voltage terminal VDD and a ground voltage terminal VSS. A PMOS transistor P1 and an NMOR transistor N1 are connected in series between the power supply voltage terminal VDD and the ground voltage terminal VSS. The PMOS transistor P1 is always in a turned-on state since its gate is grounded. A divided voltage generated by the resistors R1 and R2 is applied to a gate of the NMOS transistor N1. A power-up signal POWER_UP generated by the turn-on/turn-off operation of the PMOS transistor P1 and the NMOS transistor N1 is provided to a reference voltage generator (not shown) through an inverter INV1.

In the conventional power-up circuit having the above-described structure, the PMOS transistor P1 maintains a turned-on state because it receives a ground voltage as a gate voltage when a power supply voltage begins to be supplied (a state where a voltage level of the power supply voltage does not reach a voltage level enough to generate the power-up signal) Due to this operation, a voltage applied to an output terminal becomes a high level state and is inverted by an inverter INV1 to output a low signal. At this point, the power-up signal maintains the ground voltage.

Thereafter, the voltage level of the power supply voltage rises sufficiently, and the NMOS transistor N1 is turned on by a divided voltage generated by the resistors R1 and R2. In this case, the voltage applied to the output terminal becomes a low level state. The voltage is inverted by the inverter INV1 to output a high signal as a high level power-up signal. That is, the power-up signal level maintains the ground voltage and follows the voltage level of the power supply voltage from the moment when the high signal is generated. An internal circuit of a semiconductor memory device changes from a reset mode to an operation mode when the power-up signal level changes from a low level to a high level. The operation waveform diagram of this case is illustrated in FIG. 2.

In the conventional power-up circuit, however, if the usage of the power supply voltage inside the device rapidly increases, the voltage level of the power supply voltage being the power-up supply voltage is rapidly lowered and thus the power-up signal may not be generated normally, even though the external power supply voltage is constantly supplied. That is, the power-up signal is reset by the lowered power supply voltage, and the chip is reset by the resetting of the power-up signal, thus causing malfunctions.

In addition, the voltage level of the external power supply voltage used as the operating voltage of the semiconductor memory device is gradually lowered, and a power-up reset skew window is almost fixed according to process condition. Hence, a power-up reset signal variation range relative to a voltage level of the external voltage (VDD) is relatively significantly larger. Consequently, despite that the voltage level of the external power supply voltage reaches the operating level of the semiconductor memory device, the power-up reset signal is not generated at a proper time. Consequently, the internal circuit of the semiconductor memory device is not reset.

SUMMARY OF THE INVENTION

An embodiment of the present invention is directed to providing a power-up circuit for a semiconductor memory device, which is capable of controlling a stable generation of a power-up signal.

In accordance with an aspect of the present invention, there is provided a power-up circuit for a semiconductor memory device comprising a voltage division unit configured to divide a power supply voltage, a first power-up generation unit configured to detect a voltage level of a first divided voltage of the voltage division unit during an initial stage of applying a power supply to generate a first power-up signal and a second power-up generation unit configured to detect a voltage level of a second divided voltage of the voltage division unit, after the first power-up signal is generated from the first power-up generation unit, to generate a second power-up signal.

In accordance with another aspect of the present invention, there is provided a power-up circuit comprising a voltage division unit configured to divide a power supply voltage, a first detection unit configured to detect a voltage level of a first divided voltage outputted from the voltage division unit to generate a first power-up signal, a second detection unit configured to detect the voltage level of the first divided voltage outputted from the voltage division unit, a third detection unit configured to detect a voltage level of a second divided voltage output from the voltage division unit, a control unit configured to control the first and second detection voltages of the second and third detection units, a latch unit configured to latch an output of the control unit and a driving unit configured to be driven by an output of the latch unit to generate a second power-up signal.

In accordance with another aspect of the present invention, there is provided a power-up circuit for a semiconductor memory device, the power-up circuit comprising a first power-up generation unit configured to detect a voltage level of a first divided voltage during an initial stage of applying a power supply to generate a first power-up signal, a second power-up generation unit configured to detect a voltage level of a second divided voltage, after the first power-up signal is generated from the first power-up generation unit, to generate a second power-up signal, a first internal circuit configured to control an internal operation to be performed by the first power-up signal generated from the first power-up generation unit and a second internal circuit configured to reset an internal operation in response to the second power-up signal generated from the second power-up generation unit.

DESCRIPTION OF SPECIFIC EMBODIMENTS

Figure 1:
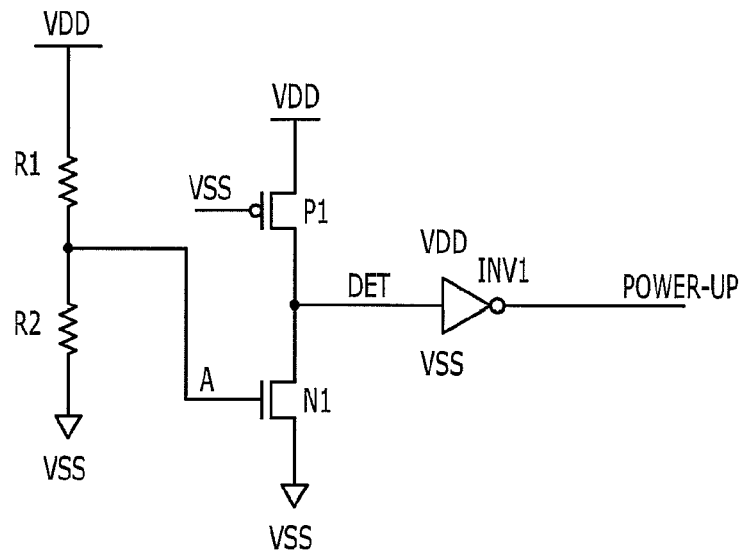
FIG. 1 is a circuit diagram of a conventional power-up circuit.
Figure 2:
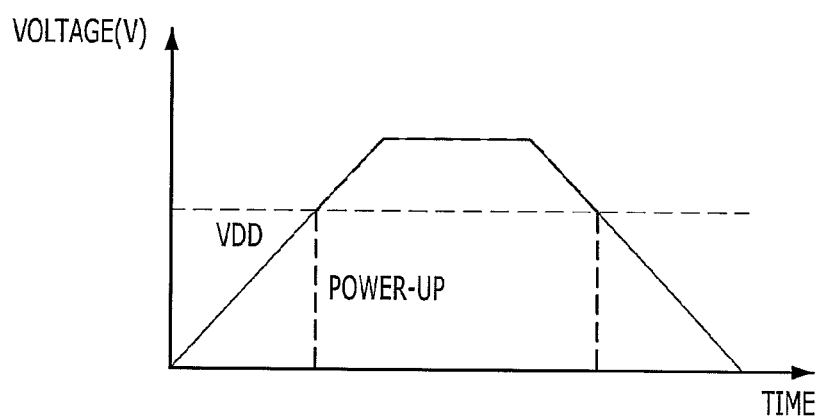
FIG. 2 is a waveform diagram of a power-up signal in a conventional power-up circuit.

Other objects and advantages of the present invention can be understood with the following description, and become apparent with reference to the embodiments of the present invention. The present invention may, however, be embodied in different forms and should not be construed as limited to the embodiments set forth herein. In the drawings, the dimensions of layers and regions are exemplary and may not be exact. Like reference numerals refer to like elements throughout.

Figure 3:
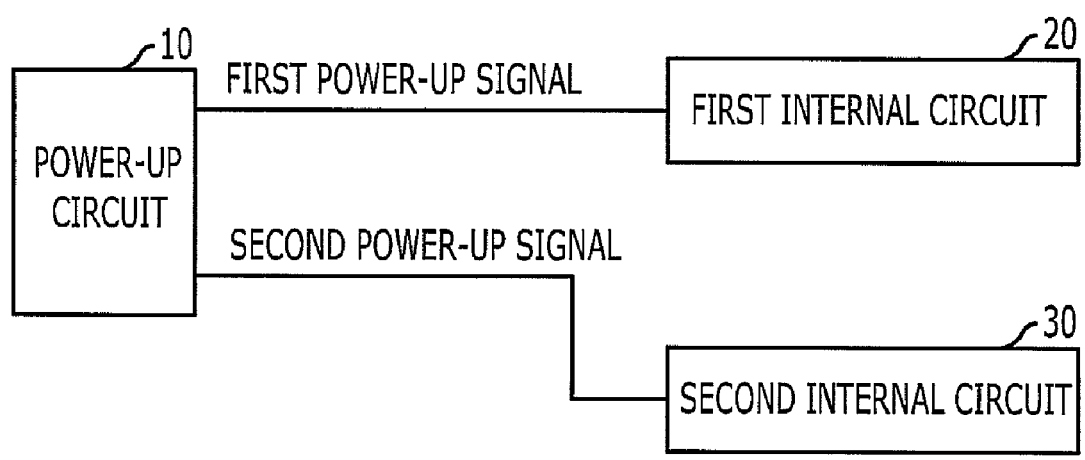
FIG. 3 is a block diagram of a power-up circuit for a semiconductor memory device in accordance with an embodiment of the present invention.

FIG. 3 is a block diagram of a power-up circuit for a semiconductor memory device in accordance with an embodiment of the present invention.

Referring to FIG. 3, a power-up circuit 10 in accordance with an embodiment of the present invention is designed to generate two power-up signals. Specifically, a first internal circuit 20 operating relatively slowly due to a large delay value when a voltage level of a power supply voltage is significantly lowered by an internal operation receives a first power-up signal that is generated in the same way as in the prior art. A second internal circuit 30, which resets a chip when a power supply voltage level is significantly lowered by an operation of an internal circuit, is controlled to receive a second power-up signal and operate stably, thereby preventing failure of a semiconductor memory device.

Figure 4:
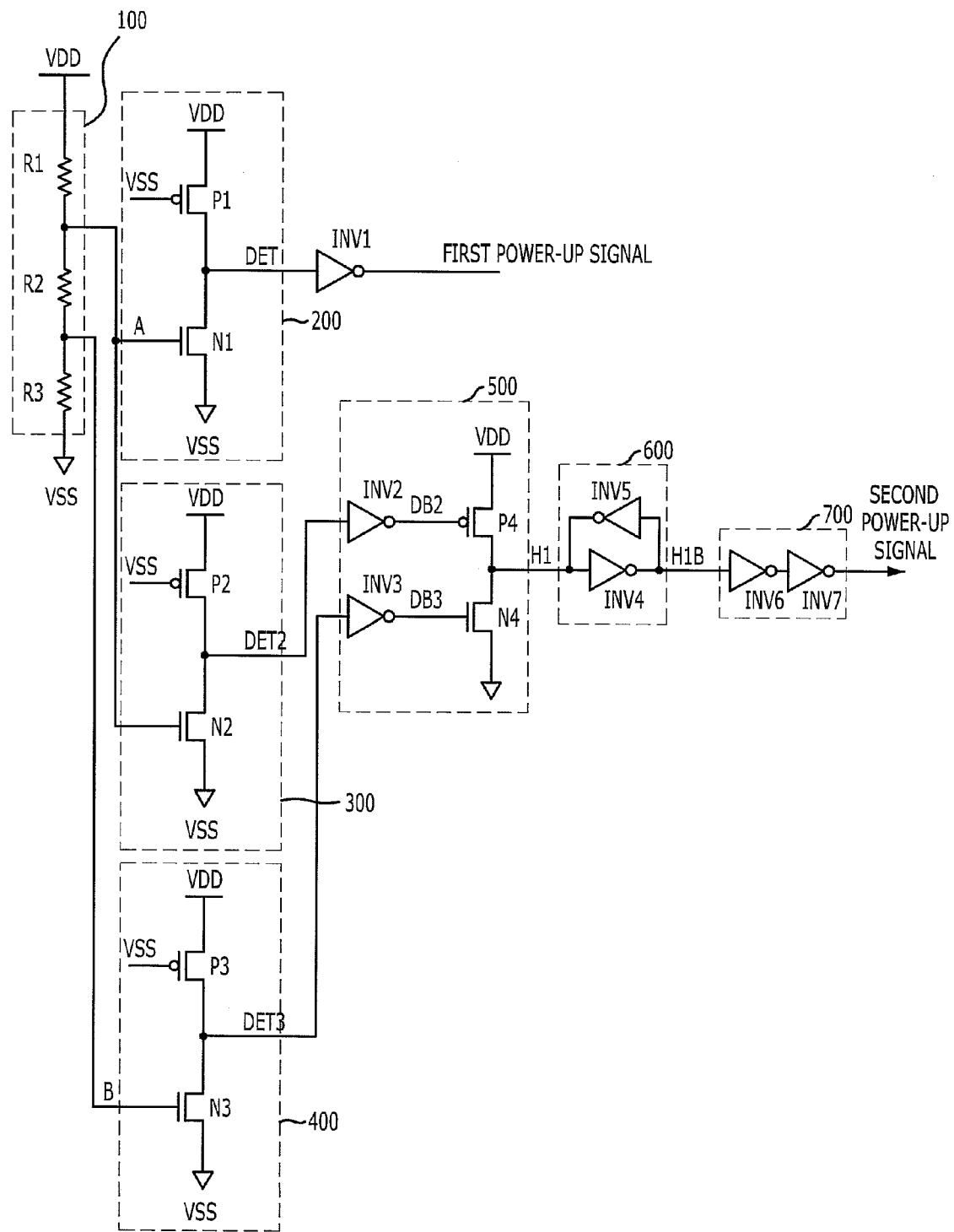
FIG. 4 is a circuit diagram of the power-up circuit in accordance with an embodiment of the present invention.

FIG. 4 is a circuit diagram of the power-up circuit for the semiconductor memory device in accordance with an embodiment of the present invention.

Referring to FIG. 4, the power-up circuit includes a plurality of resistors R1, R2 and R3 connected in series between a power supply voltage terminal VDD and a ground voltage terminal VSS. The plurality of resistors R1, R2 and R3 constitute a voltage division unit 100 to divide a power supply voltage.

A PMOS transistor P1 and an NMOS transistor N1 are connected in series between the power supply voltage terminal VDD and the ground voltage terminal VSS. The PMOS transistor P1 is always in a turned-on state since its gate is connected to the ground voltage terminal VSS. A divided voltage generated by the resistors R1 and R2 is applied to a gate of the NMOS transistor N1. Therefore, the PMOS transistor P1 and the NMOS transistor N1 constitute a first detection unit 200 for detecting a voltage level of the power supply voltage by using the divided voltage A at an intervening node between the resistors R1 and R2.

A power-up signal generated by the turn-on/turn-off operation of the PMOS transistor P1 and the NMOS transistor N1 is provided to the first internal circuit 20 through an inverter INV1.

Furthermore, the power-up circuit includes a second detection unit 300 for detecting the divided voltage of the voltage division unit 100. The second detection unit 300 detects the divided voltage A at an intervening node between the resistors R1 and R2. The second detection unit 300 includes a PMOS transistor P1 and an NMOS transistor N2 connected in series between the power supply voltage terminal VDD and the ground voltage terminal VSS. The PMOS transistor P2 is always in a turned-on state because its gate is connected to the ground voltage terminal VSS. The divided voltage A generated by the resistors R1 and R2 is applied to a gate of the NMOS transistor N2.

Furthermore, the power-up circuit includes a third detection unit 400 for detecting another divided voltage of the voltage division unit 100. The third detection unit 400 detects a divided voltage B at an intervening node between the resistors the resistors R2 and R3. The third detection unit 400 includes a PMOS transistor P3 and an NMOS transistor N3 connected in series between the power supply voltage terminal VDD and the ground voltage terminal VSS. The PMOS transistor P3 is always in a turned-on state because its gate is connected to the ground voltage terminal VSS. The divided voltage B generated by the resistors R1, R2 and R3 is applied to a gate of the NMOS transistor N3.

A detection voltage DET2 detected by the second detection unit 300 is provided as a gate voltage of a PMOS transistor P3 through an inverter INV2. A detection voltage DET3 detected by the third detection unit 400 is provided as a gate voltage of an NMOS transistor N4 through an inverter INV3. Therefore, the PMOS transistor P4 and the NMOS transistor N4 receiving the detection voltages DET2 and DET3 as the gate voltages constitute a control unit 500 for detecting a voltage level of the power supply voltage and controlling the generation of a power-up signal according to the detected voltage level. The control unit 400 includes the PMOS transistor P4 and the NMOS transistor N4 connected in series between the power supply voltage terminal VDD and the ground voltage terminal VSS.

The power-up signal generated by the control unit 500 passes through a latch unit 600 having a back-to-back connection of two inverters INV4 and INV5. An output of the latch unit 600 is provided to the second internal circuit 30 through a driving unit implemented with inverters INV6 and INV7.

The operation of the power-up circuit for the semiconductor memory device in accordance with the embodiment of the present invention will be described below.

First, the operation when the power supply voltage begins to be supplied and is at a very low level will be described.

When the power supply voltage begins to be supplied, the divided voltages A and B generated by the voltage division unit 100 are all at a low level. Therefore, the divided voltage A does not exceed threshold voltages of the NMOS transistors N1 and N2. The divided voltage B also does not exceed a threshold voltage of the NMOS transistor N3. That is, the NMOS transistors N1, N2 and N3 are all in a turned-off state.

Due to the above-described operation, the detection voltages DET, DET2 and DET3 of the first, second and third detection units 200, 300 and 400 have a high level. Since the detection voltage DET is a high level, the first power-up signal of a low level is outputted.

Also, since the detection voltage DET2 is a high level, a signal DB2 outputted from the inverter INV2 is a low level and therefore the PMOS transistor P4 is turned on. On the contrary, the detection voltage DET3 changes from a high level to a low level through the inverter INV3, and turns the NMOS transistor N4 off. As a result, an output signal H1 of the control unit 500 has a low level and changes to a low level through the latch unit 600 and the driving unit 700, so that the second power-up signal has a low level.

When the power supply voltage rises relatively slightly, the divided voltage A becomes a high level, but the divided voltage B is still at a low level. Since the divided voltage A exceeds the threshold voltages of the NMOS transistors N1 and N2, the NMOS transistors N1 and N2 are turned on. On the contrary, since the divided voltage B does not exceed the threshold voltage of the NMOS transistor N3, the NMOS transistor N3 is in a turned-off state.

Due to the above-described operation, the detection voltages DET and DET2 of the first and second detection units 200 and 300 have a low level, and the detection voltage DET3 of the third detection unit 400 has a high level. Since the detection voltage DET has a low level, the first power-up signal of a high level is outputted.

Also, since the detection voltage DET2 is a low level, a signal DB2 outputted from the inverter INV2 is a high level and therefore the PMOS transistor P4 is turned off. On the contrary, the detection voltage DET3 changes from a high level to a low level through the inverter INV3, and turns the NMOS transistor N4 off. Since the latch unit 600 maintains the previous state, that is, a low level state, the second power-up signal becomes a low level.

When the power supply voltage reaches a target voltage level, the divided voltages A and B of the voltage division unit 100 have a high level. Thus, the divided voltage A exceeds the threshold voltages of the NMOS transistors N1 and N2, and the divided voltage B also exceeds the threshold voltage of the NMOS transistor N3. That is, the NMOS transistors N1, N2 and N3 are turned on.

Due to the above-described operation, the detection voltages DET, DET2 and DET3 of the first, second and third detection units 200, 300 and 400 have a low level. Since the detection voltage DET has a low level, the first power-up signal of a high level is outputted.

Also, since the detection voltage DET2 is a low level, a signal DB2 outputted from the inverter INV2 is a high level and therefore the PMOS transistor P4 is turned off. On the contrary, the detection voltage DET3 changes from a low level to a high level through the inverter INV3, and turns the NMOS transistor N4 off. Therefore, the output signal of the control unit 500 becomes a low level and changes to a high level through the latch unit 600 and the driving unit 700. Consequently, the second power-up signal changes to a high level.

The following description is provided for a case where the internal circuit is normally operated by the power-up signal and the voltage level of the power supply voltage is relatively slightly lowered by the operation of the internal circuit.

When the voltage level of the power supply voltage is relatively slightly lowered, the divided voltage A maintains a high level, but the divided voltage B changes to a low level. Therefore, the divided voltage A exceeds threshold voltages of the NMOS transistors N1 and N2, and the NMOS transistors N1 and N2 are turned on. On the contrary, the divided voltage B does not exceed the threshold voltage of the NMOS transistor N3. That is, the NMOS transistor N3 is in a turned-off state.

Due to the above-described operation, the detection voltages DET and DET2 of the first and second detection units 200 and 300 have a low level, and the detection voltage DET3 of the third detection unit has a high level. Since the detection voltage DET is a low level, the first power-up signal of a high level is outputted.

Also, since the detection voltage DET2 is a low level, the signal DB2 outputted from the inverter INV2 is a high level and therefore the PMOS transistor P4 is turned off. On the contrary, the detection voltage DET3 changes from a high level to a low level through the inverter INV3, and turns the NMOS transistor N4 off. At this point, the latch unit 600 maintains the previous state (high level), and the second power-up signal maintains a high level state.

Then, when the voltage level of the power supply voltage is significantly lowered by the operation of the internal circuit, the following operation is performed.

When the voltage level of the power supply voltage is significantly lowered, the divided voltages A and B are also lowered. The divided voltage A does not exceed the threshold voltages of the NMOS transistors N1 and N2. The divided voltage B also does not exceed the threshold voltage of the NMOS transistor N3. That is, the NMOS transistors N1, N2 and N3 are all in a turned-off state.

Due to the above-described operation, the detection voltages DET, DET2 and DET3 of the first, second and third detection units 200, 300 and 400 have a high level. Since the detection voltage DET has a high level, the first power-up signal changes to a low level.

Also, since the detection voltage DET2 is a high level, the signal DB2 outputted from the inverter INV2 is a low level and therefore the PMOS transistor P4 is turned on. On the contrary, the detection voltage DET3 changes from a high level to a low level through the inverter INV3, and turns the NMOS transistor N4 off. Therefore, the output signal H1 of the control unit 500 becomes a high level and then changes to a low level through the latch unit 600 and the driving unit 700. The second power-up signal changes to a low level.

Figure 5:
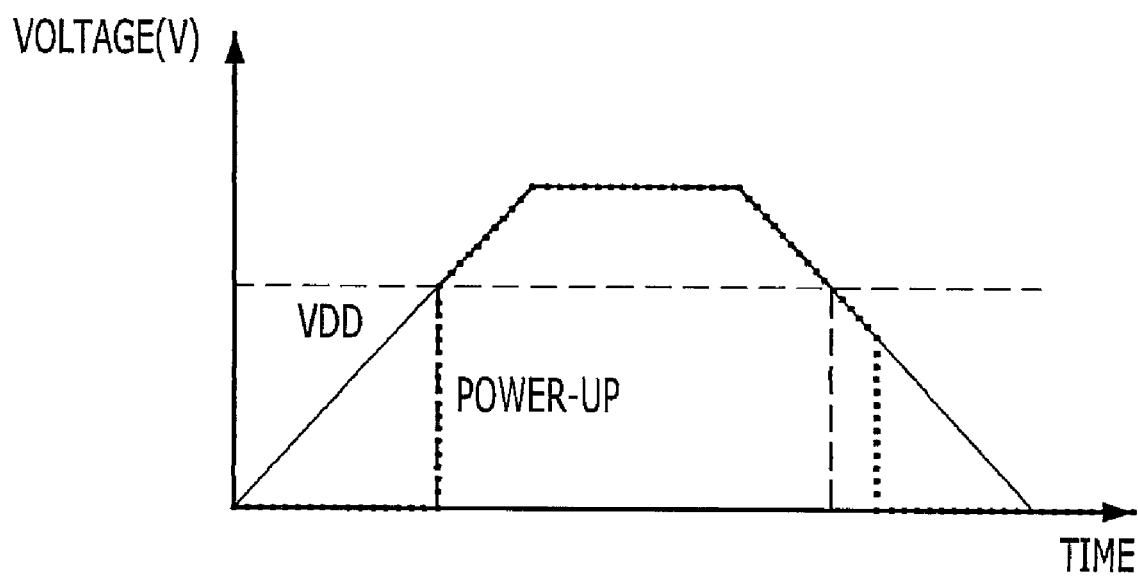
FIG. 5 is a waveform diagram of a power-up signal in the power-up circuit in accordance with the embodiment of the present invention.

As illustrated in FIG. 5, in the initial operation of starting to supply the power supply voltage, the high voltage level rising up to the target voltage level is detected to control the operation. After the power-up signal is normally generated, the voltage level of the detection voltage is decreased to prevent malfunction of the chip. That is, even when the voltage level of the power supply voltage is significantly lowered due to the increase in the usage of internal power, the power-up signal is stably controlled to thereby prevent the failure of the chip, because the voltage level of the detection voltage is controlled at a lowered level.

The foregoing embodiments are provided for exemplary purposes. The present invention may also be applied to the case where the semiconductor memory device is controlled to operate stably by lowering the reset voltage detection level for the reset operation of the chip after the power-up signal is generated.

In accordance with the embodiments of the present invention, when the power is supplied to the semiconductor memory device and rises up to the target voltage level, the high voltage level is detected to control the operation. By lowering the detection level of the reset voltage after the operation of the semiconductor memory device, the operation margin of the device is given even though the voltage level of the operating voltage is significantly lowered by the use of the internal voltage, thereby preventing frequent failure of the chip.

While the present invention has been described with respect to the specific embodiments, it will be apparent to those skilled in the art that various changes and modifications may be made without departing from the spirit and scope of the invention as defined in the following claims.

What is claimed is:

1. A power-up circuit for a semiconductor memory device, comprising:
    a voltage division unit configured to divide a power supply voltage;
    a first power-up generation unit configured to detect a voltage level of a first divided voltage of the voltage division unit during an initial stage of applying a power supply to generate a first power-up signal; and
    a second power-up generation unit configured to detect a voltage level of a second divided voltage of the voltage division unit, after the first power-up signal is generated from the first power-up generation unit, to generate a second power-up signal,
    wherein the second power-up generation unit comprises:
        a first detection unit configured to detect the voltage level of the first divided voltage;
        a second detection unit configured to detect the voltage level of the second divided voltage; and
        a driving unit configured to be driven by the detected levels of the first and second detection units.

2. The power-up circuit of claim 1, wherein the voltage division unit comprises a plurality of resistors connected in series between a power supply voltage terminal and a ground voltage terminal to divide the power supply voltage by the resistors.

3. The power-up circuit of claim 2, wherein the voltage division unit generates at least first and second divided voltages having different voltage levels.

4. The power-up circuit of claim 3, wherein the voltage level of the first divided voltage is relatively higher than the voltage level of the second divided voltage.

5. The power-up circuit of claim 1, wherein the first power-up generation unit comprises:
    a first transistor configured to receive a ground voltage as a gate voltage; and
    a second transistor configured to receive the first divided voltage as a gate voltage, the first transistor and the second transistor being connected in series between a power supply voltage terminal and a ground voltage terminal.

6. The power-up circuit of claim 5, wherein the first transistor comprises a PMOS transistor.

7. The power-up circuit of claim 5, wherein the second transistor comprises an NMOS transistor.

8. The power-up circuit of claim 5, wherein the first power-up generation unit further comprises an inverter configured to invert a detected level outputted by the driving of the first and second transistors.

9. The power-up circuit of claim 1, wherein the first detection unit comprises:
    a third transistor configured to receive a ground voltage as a gate voltage; and
    a fourth transistor configured to receive the first divided voltage as a gate voltage, the third transistor and the fourth transistor being connected in series between a power supply voltage terminal and a ground voltage terminal.

10. The power-up circuit of claim 1, wherein the second detection unit comprises:
    a fifth transistor configured to receive a ground voltage as a gate voltage; and
    a sixth transistor configured to receive the second divided voltage as a gate voltage, the fifth transistor and the sixth transistor being connected in series between a power supply voltage terminal and a ground voltage terminal.

11. The power-up circuit of claim 1, wherein the driving unit comprises:
    a first driving unit configured to be driven by the detected levels of the first and second detection units;
    a latch unit configured to latch an output of the first driving unit; and
    a second driving unit configured to be driven by an output of the latch unit.

12. The power-up circuit of claim 11, wherein the first driving unit comprises:
    a first inverter configured to invert the detected level of the first detection unit;
    a seventh transistor configured to receive an output of the first inverter as a gate voltage;
    a second inverter configured to invert the detected level of the second detection unit; and
    an eighth transistor configured to receive an output of the second inverter as a gate voltage.

13. The power-up circuit of claim 12, wherein the seventh and eighth transistors comprise a MOS transistor.

14. The power-up circuit of claim 11, wherein the latch unit has two inverters that are each connected at its input to an output of the other one.

15. A power-up circuit, comprising:
    a voltage division unit configured to divide a power supply voltage;
    a first detection unit configured to detect a voltage level of a first divided voltage outputted from the voltage division unit to generate a first power-up signal;
    a second detection unit configured to detect the voltage level of the first divided voltage outputted from the voltage division unit and generate a first detection voltage;
    a third detection unit configured to detect a voltage level of a second divided voltage output from the voltage division unit and generate a second detection voltage;
    a control unit configured to control a logic level of an output of the control unit in response to the first and second detection voltages;
    a latch unit configured to latch the output of the control unit; and
    a driving unit configured to be driven by an output of the latch unit to generate a second power-up signal.

16. The power-up circuit of claim 15, wherein the voltage level of the first divided voltage is relatively higher than the voltage level of the second divided voltage.

17. The power-up circuit of claim 15, wherein the control unit comprises:
- a first inverter configured to invert the first detection voltage;
- a transistor configured to receive an output of the first inverter as a gate voltage;
- a second inverter configured to invert the second detection voltage; and
- a transistor configured to receive an output of the second inverter as a gate voltage.

18. The power-up circuit of claim 15, wherein the latch unit has two inverters that are each connected at its input to an output of the other one.

* * * * *